United States Patent
Seliger et al.

(10) Patent No.: US 7,427,532 B2
(45) Date of Patent: Sep. 23, 2008

(54) METHOD OF MANUFACTURING A DEVICE HAVING A CONTACTING STRUCTURE

(75) Inventors: Norbert Seliger, München (DE); Karl Weidner, München (DE); Jörg Zapf, München (DE)

(73) Assignee: Siemens Aktiengesellschaft, Munich (DE)

( * ) Notice: Subject to any disclaimer, the term of this patent is extended or adjusted under 35 U.S.C. 154(b) by 386 days.

(21) Appl. No.: 10/547,119

(22) PCT Filed: Jan. 23, 2004

(86) PCT No.: PCT/EP2004/000574

§ 371 (c)(1),
(2), (4) Date: Aug. 26, 2005

(87) PCT Pub. No.: WO2004/077547

PCT Pub. Date: Sep. 10, 2004

(65) Prior Publication Data

US 2006/0252253 A1   Nov. 9, 2006

(30) Foreign Application Priority Data

Feb. 28, 2003   (DE) ................................ 103 08 977

(51) Int. Cl.
  *H01L 21/50* (2006.01)
  *H01L 21/48* (2006.01)
(52) U.S. Cl. .................. 438/106; 438/55; 257/736; 257/E23.004; 257/E21.499
(58) Field of Classification Search ................ 438/55, 438/106; 257/736, E23.004, E21.499
  See application file for complete search history.

(56) References Cited

U.S. PATENT DOCUMENTS

| | | | |
|---|---|---|---|
| 4,927,505 A * | 5/1990 | Sharma et al. ............. 205/123 |
| 5,289,632 A * | 3/1994 | Chalco et al. ................ 29/846 |
| 5,291,066 A | 3/1994 | Neugebauer et al. |
| 5,616,886 A | 4/1997 | Romero et al. |
| 5,637,922 A | 6/1997 | Fillion et al. |
| 6,465,276 B2 | 10/2002 | Kuo |
| 2005/0032347 A1 | 2/2005 | Hase et al. |

FOREIGN PATENT DOCUMENTS

| | | |
|---|---|---|
| DE | 91 09 295 U1 | 11/1991 |
| DE | 42 28 274 A1 | 3/1994 |
| DE | 198 30 540 A1 | 1/2000 |
| DE | 199 54 941 A1 | 6/2001 |
| EP | 0 747 949 A2 | 12/1996 |
| WO | WO 03/030247 A2 | 4/2003 |

OTHER PUBLICATIONS

Paavo Jalonen; "A new concept® for making fine line substrate for active component in polymer"; Microelectronics Journal; Feb. 2003; pp. 99-107; vol. 34, No. 2; Mackintosh Publications Ltd.; Luton, Germany.

A. Ostmann, A Neumann; "Chip in Polymer—the Next Step in Miniaturization"; Advancing Microelectronics; May/Jun. 2002; pp. 13-15; vol. 29, No. 3.

Burhan Ozmat, Charlie S. Korman, Ray Fillion; "An Advanced Approach to Power Module Packaging"; pp. 8-11; IEEE 2000; 0-7803-6437-6.

* cited by examiner

*Primary Examiner*—Asok K Sarkar

(57) ABSTRACT

According to the invention, a layer made of an electrically insulating material is applied to a substrate and a component that is arranged thereupon in such way that said layer follows the surface contour formed by the substrate and the component.

20 Claims, 1 Drawing Sheet

METHOD OF MANUFACTURING A DEVICE HAVING A CONTACTING STRUCTURE

CROSS REFERENCE TO RELATED APPLICATIONS

This application is the US National Stage of International Application No. PCT/EP2004/000574, filed Jan. 23, 2004 and claims the benefit thereof. The International Application claims the benefits of German application No. 10308977.2, filed Feb. 28, 2003. The International Application and the German application are incorporated by reference herein in their entirety.

FIELD OF INVENTION

The invention relates to a method of manufacturing a component having a contacting structure.

BACKGROUND OF INVENTION

The most widely used technology for interconnecting power semiconductor chips and connecting them to conductor tracks is thick-wire bonding. In this technique ultrasound energy is used to achieve a permanent connection between an Al wire, which has a typical diameter of several 100 μm, and the contact surface, which is an Al surface on the chip or Cu surface on the power module, via an intermetallic connection.

Other methods may be used as alternatives to bonding, such as the ThinPak technique in which contact is made with the chip surface via solder applied over holes in a ceramic plate.

In MPIPPS (Metal Posts Interconnected Parallel Plate Structures), the contacts are made by means of soldered copper posts.

Another method for making contact is via solder bumps in flip-chip technology. This method additionally facilitates improved heat dissipation, since the power semiconductors can be soldered onto DCB substrates on the upper and lower face (DCB stands for Direct Copper Bonding).

It is also possible for contact to be made over a large area via vapor-deposited Cu leads, wherein the conducting-track insulation (Power Module Overlay Structure) is produced by vapor-phase deposition (CVD technique).

Finally, a method for making contact using a patterned foil via an adhesive or solder process has also been disclosed.

U.S. Pat. No. 5,616,886 contains a proposal for a bondless module, in which no process details are specified.

In Ozmat B., Korman C. S. and Filion R.: "An Advanced Approach to Power Module Packaging", 0-7803-6437-6/00, IEEE, 2000 a method is disclosed whereby power semiconductors are applied to a film that is stretched in a frame.

In Ostmann A., Neumann A.: "Chip in Polymer—the Next Step in Miniaturization", in "Advancing Microelectronics", Volume 29, No. 3, May/June 2002, a method is disclosed whereby logic chips located on a substrate are embedded in a polymer.

SUMMARY OF INVENTION

An object of the invention is to provide a method for making contact with one or more electrical contact surfaces of a module located on a substrate, said method being suitable for power electronics and offering the possibility of contact being adapted to high power outputs.

This object is achieved by the claims. Advantageous embodiments are described in the dependent claims.

Accordingly, in a method for manufacturing a device having a component arranged on a substrate, in which said component has an electrical contact surface, a layer made of electrically insulating material is applied to the substrate and component.

After the layer of electrically insulating material is applied, the electrical contact surface of the component is at least partially exposed. By exposing the contact surface, a window is made in the layer of electrically insulating material, said window being over 60%—and, in particular, over 80%—of the size of the lateral and/or top surface of the component in which the window is made. The method is therefore particularly suitable for power components for which a contact window and a contact surface of appropriate size are provided for making contact with a flat conductor. In particular, the window is made in the component side that is the largest and/or that faces away from the substrate, and preferably has an absolute size of more than 50 $mm^2$, in particular more than 70 $mm^2$, or even more than 100 $mm^2$.

Alternatively to or in addition to exposing the contact surface of the component, the layer made of electrically insulating material can also be applied so that the contact surface of the component remains at least partially uncovered, whereby a window is made that is more than 60%—and, in particular, more than 80%—of the size of the lateral and/or top surface of the component in which the window is made. The complete or partial exposure can be implemented to particular advantage as early as the application stage, if the layer of electrically insulating material is applied in the form of a film. This is because a film in which one or more corresponding openings or windows have been cut out or stamped out by cost-effective means, can be used from the start.

In a subsequent stage, a layer made of electrically conductive material is applied to the layer of electrically insulating material and the electrical contact surface of the component. The layer of electrically insulating material therefore acts as a base layer for the layer of electrically conductive material.

Of course, the invention can also be applied accordingly for a substrate on which a plurality of components with contact surfaces are arranged, and/or for components with a plurality of contact surfaces.

To ensure that the edges of the component are neatly covered, on the other hand, the size of the window should be no more than 99.9% of the size of the lateral and/or top surface of the component in which the window is made, in particular no more than 99%, and ideally no more than 95%.

To enable the component to make contact with the substrate, said substrate preferably has an electrical contact surface that remains free and/or exposed and to which the layer made of electrically conductive material is likewise applied. The contact surface of the component is therefore connected to the contact surface of the substrate via the layer of electrically conductive material.

The contact surface of the component and the contact surface of the substrate are preferably approximately the same size, in order to ensure a continuous current flow.

Since the component is arranged on the substrate, said substrate and component form a surface contour. In particular, the layer of electrically insulating material is applied to the substrate and component in such a way that said layer of electrically insulating material follows the surface contour formed by the substrate and the component, i.e. the surface contour of the layer of electrically insulating material corresponds to the surface contour formed by the substrate and component. If, on the other hand, logic chips are embedded in a polymer according to the prior art, then only the underside of the polymer layer follows the surface contour, and not the polymer layer itself.

There are two advantages resulting from the fact that the layer of electrically insulating material follows the surface contour formed by the substrate and component, particularly if a power component is used as the component. Firstly, the layer of electrically insulating material, which covers the component edges facing away from the substrate, is guaranteed to be thick enough to prevent breakdown in the event of high voltages or field strengths. Secondly, the layer of electrically insulating material is not usually applied so thickly to the substrate alongside the power component, said component usually being very high, as to make exposure of and contact by contact surfaces to conductor tracks difficult.

The thickness of the layer of electrically insulating material over the substrate in linear terms differs from the thickness of the layer of electrically insulating material over the component (2) in linear terms, by less than 50%, and—in particular—by less than 20%. The thicknesses of the two layers are preferably almost equal, and therefore differ from one another by less than 5% or even by less than 1%. These percentages relate in particular to the thickness of the layer over the component in linear terms, which is accordingly 100%. The figure is based on the linear measurement, since the layer is usually thicker on inner edges of substrate and component, and thinner over the component edges facing away from the substrate.

Any organic-based or inorganic-based circuit carriers can be used as substrates, such as PCB (printed Circuit Board), DCB, IM (Insulated Metal), HTCC (High Temperature Cofired Ceramics) and LTCC (Low Temperature Cofired Ceramics) substrates.

In particular, the layer of electrically insulating material is made from plastic. It may be photosensitive or non-photosensitive depending on its further processing.

It is preferably applied using one or more of the following procedures: curtain casting, dipping, in particular single-sided dipping, spraying, in particular electrostatic spraying, printing, in particular screen printing, overmolding, dispensing, spin coating, lamination with a film.

It is sometimes advantageous if the layer of electrically insulating material is not film. However, if a film is used for the layer of electrically insulating material, then the lamination is advantageously performed in a vacuum press, where vacuum forming, hydraulic vacuum compression, vacuum gas compression or similar lamination techniques are possible. The pressure is advantageously applied isostatically. Lamination is performed, for example, at temperatures of 100° C. to 250° C. and a pressure of 1 bar to 10 bar. The precise lamination process parameters, i.e. pressure, temperature, time etc., depend among other factors on the topology of the substrate, of the plastic material used for the film and of the thickness of the film.

The film can be made of any thermoplastic or duroplastic material or mixtures of these. In the method according to the invention, a film made of a plastic material based on one of the following: polyimide (PI), polyethylene (PE), polyphenol, polyetheretherketone (PEEK) and/or epoxy, can be used preferably and advantageously as the film, the surface of the film having an adhesive coating to improve surface adhesion. The substrate surface may also be coated with an adhesive, preferably silane compounds.

After lamination, a tempering stage is performed. Thermal treatment and networking improve the adhesion and the thermal, physical and mechanical properties of the film on the surface.

To apply the layer of electrically insulating material, i.e. to make planar contact, it is advantageous to use physical or chemical deposition of the electrically conductive material. Physical techniques of this kind are sputtering and PVD (Physical Vapor Deposition). Chemical deposition can be performed from the gaseous phase (Chemical Vapor Deposition, CVD) and/or liquid phase (Liquid Phase Chemical Vapor Deposition). It is also possible that a thin electrically conductive partial layer, for example of titanium/copper, is applied by one of these methods, and then a thicker electrically conductive partial layer, for example of copper, is applied to this by electroplating.

Preferably, in the method according to the invention a substrate is used having a surface populated with one or more semiconductor chips, in particular power semiconductor chips, on each of which are one or more contact surfaces to which contact is to be made, wherein the layer of electrically insulating material is applied to this surface under vacuum, so that the layer of electrically insulating material covers this surface including every semiconductor chip and every contact surface with a tight fit, and adheres to this surface including every semiconductor chip.

The layer of electrically insulating material is designed here so that it can surmount a height difference of up to 1000 µm. Reasons for the height difference include the substrate topology and the semiconductor chips arranged on the substrate.

The thickness of the layer of electrically insulating material can equal 10 µm to 500 µm. Preferably, a layer comprising an electrically insulating material of thickness 25 µm to 150 µm is applied in the method according to the invention.

In a further embodiment, the application is repeated as many times as is necessary to achieve a certain thickness of the layer of electrically insulating material. For example, thinner partial layers of electrically insulating material are made into a thicker partial layer of electrically insulating material. These partial layers of electrically insulating material are preferably made of a type of plastic material. It is also possible for the partial layers of electrically insulating material to be made from a plurality of different plastic materials. This results in a layer of electrically insulating material formed from partial layers.

In a particular embodiment, a window is made in the layer of electrically insulating material by laser ablation, in order to expose the electrical contact surface of the component. The wavelength of a laser used for this purpose is between 0.1 µm and 11 µm. The power of the laser is between 1 W and 100 W. For example, a $CO_2$ laser with a wavelength of 9.24 µm is used. In this process, the windows are made without damaging any aluminum, gold or copper chip contacts that may lie under the layer of electrically insulating material.

In a further embodiment, a photosensitive layer of electrically insulating material is used and a window is made by a photolithographic process, in order to expose the electrical contact surface of the component. The photolithographic process involves exposing the photosensitive layer of electrically insulating material, and developing—and thereby removing—the exposed or unexposed areas of the layer of electrically insulating material.

After the window has been made, a cleaning stage may be performed in which residues of the layer of electrically insulating material are removed. The cleaning stage is performed by a wet-chemical process, for example. In particular, a plasma cleaning technique is also possible.

In a further embodiment, a layer is used comprising a plurality of partial layers made of different electrically conductive material arranged one on top of the other. For example different metal layers are applied on top of each other. In particular, the number of partial layers or metal layers is 2 to 5. A partial layer functioning as a diffusion barrier can be integrated, for example, by the electrically conductive layer composed of a plurality of partial layers. Such a partial layer is made of a titanium-tungsten alloy (TiW), for example. Advantageously, in a multi-layer structure, a partial layer that provides or improves adhesion is applied directly to the surface to which contact is to be made. Such a partial layer is made of titanium, for example.

In a particular embodiment, after the planar contact is made, at least one conductor track is made in and/or on the layer of electrically conductive material. The conductor track can be applied to the layer. In particular, the layer is patterned to produce the conductor track. This means that the conductor track is formed in this layer. The conductor track is used, for example, to make electrical contact with a semiconductor chip.

Patterning is usually performed in a photolithographic process, in which a photoresist can be applied to the electrically conductive layer, dried and then exposed and developed. Sometimes this is followed by a tempering stage to stabilize the applied photoresist for subsequent treatment processes. Traditional positive and negative resists (coating materials) can be used as photoresists. The photoresist is applied by a spraying or dipping process, for example. Electroplating (electrostatic or electrophoretic deposition) is also possible.

A different patterning material may also be applied instead of a photoresist, by means of one or more of the following methods: curtain casting, dipping, in particular single-sided dipping, spraying, in particular electrostatic spraying, printing, in particular screen printing, overmolding, dispensing, spin coating, lamination with a film.

Photosensitive films can also be used for patterning. These are applied by lamination, and are then exposed and developed in a similar way to the applied photoresist layer.

The conductor track can be produced as follows for example: the electrically conductive layer is patterned in a first substage, and a further metallization is applied, in a subsequent substage, to the conductor track produced. The conductor track is reinforced by the additional metallization. For example, copper is applied by electroplating to the conductor track produced by patterning in a thickness of 1 μm to 400 μm. Then the photoresist layer or laminated film, or the patterning material used as an alternative, is removed. This is done using an organic solvent, an alkaline developer or similar, for example. The planar, metallically conductive layer not reinforced with the metallization is removed again by subsequent differential etching. The reinforced conductor track is retained.

In a particular embodiment, the stages comprising lamination, exposure, contact making, and creation of the conductor track are performed a number of times to produce a multi-layer device.

The invention advantageously provides a novel technology for making electrical contact and wiring up contact pads or contact surfaces arranged on semiconductor chips, in particular on power semiconductor chips. In addition, in the method according to the invention, the planar interface and the particular insulation result in a low-inductance connection to facilitate rapid and low-loss switching.

An electrical insulation layer is produced by the application of the layer of electrically insulating material. The production of the insulation layer by the application, according to the invention, of the layer of electrically insulating material provides the following advantages:

High-temperature use. For example, a layer made from electrically insulating material can withstand up to 300° C. provided a suitable material is selected.

Low process costs.

High insulation field strengths are possible by using thick insulation layers.

High production rate, e.g. DCB substrates can be processed in use.

Homogeneous insulation properties, since air pockets are prevented by processing of the layer of electrically insulating material in the vacuum.

The whole chip contact surface can be used, allowing high currents to be diverted.

The planar contacting enables the chip to be driven homogeneously.

The contact inductance for a contact surface is less than for thick-wire bonding, as a result of the planar geometry.

The contacting results in high reliability under vibration and mechanical shock stress.

Greater stress cycle endurance compared with competing methods because of lower thermo-mechanical stresses.

A plurality of wiring planes are accessible.

The described planar connection technology occupies a low overall height, resulting in a compact structure.

With multi-layer connecting planes, large-area metallization layers for screening can be realized. This is highly beneficial particularly for the EMC (electromagnetic compatibility) performance of the circuit (noise emission, noise immunity).

Preferred and advantageous embodiments of the device result from the preferred embodiments of the method.

BRIEF DESCRIPTION OF THE DRAWING

Further features and advantages of the invention result from the description of an exemplary embodiment on the basis of the drawing.

DETAILED DESCRIPTION OF THE INVENTION

Figure 1:
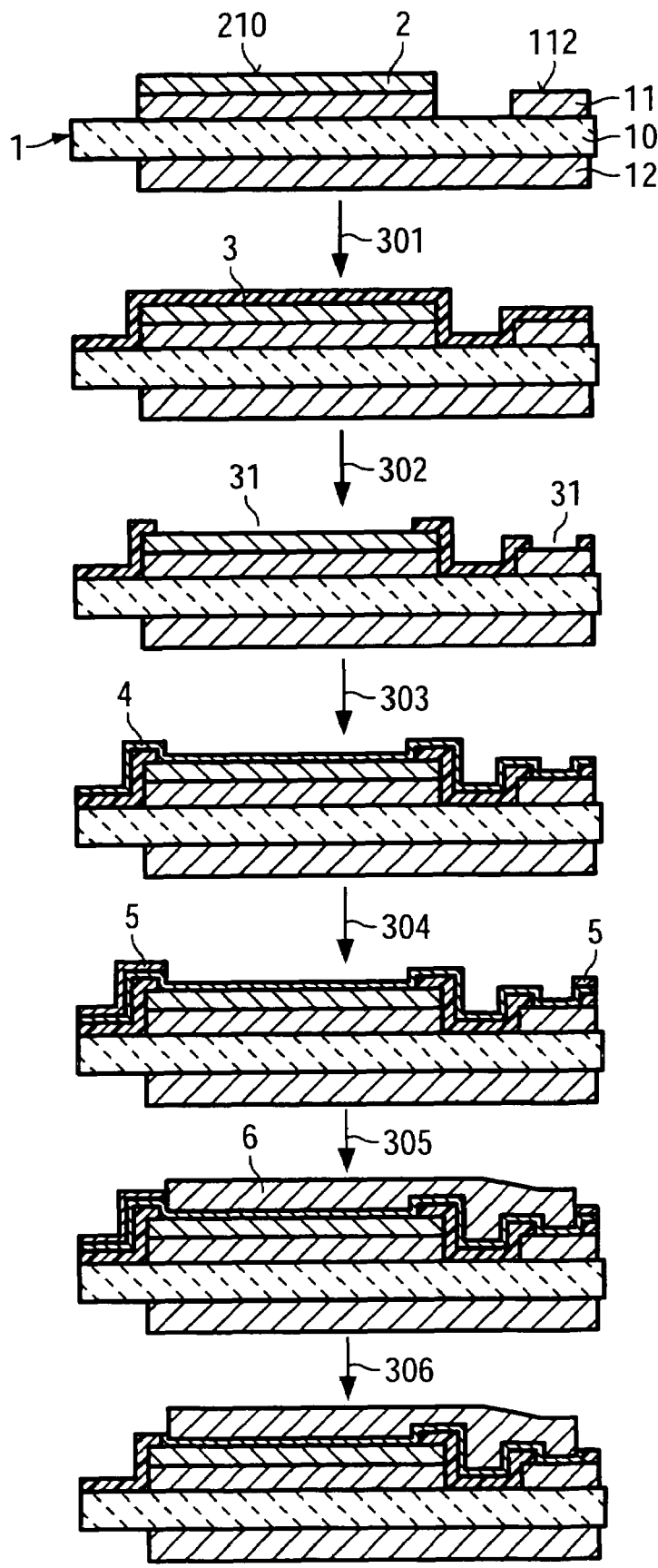
FIG. 1 shows a method for making contact with a power semiconductor.

In FIG. 1, the substrate of the example is generally labeled 1. This substrate 1 has a DCB substrate, for example, which consists of a substrate layer 10 made of ceramic material, a copper layer 12 applied to a lower surface of the substrate layer 10, and a copper layer 11 applied to a surface of the substrate layer 10 facing away from the lower surface.

Areas of the layer 11 on the upper surface of the substrate layer 10 are removed down to the upper surface of the substrate layer 10, so that the upper surface is exposed there. Conductor tracks are formed on the substrate by the copper layers 11 and 12.

One or more semiconductor chips 2, which may be identical to or different from each other, are applied to the surface of the remaining copper layer 11 facing away from the substrate layer 10.

The semiconductor chip 2, which is preferably a power semiconductor chip, makes planar contact with the upper surface of the copper layer 11 by a contact surface not shown, which exists on a lower surface of the semiconductor chip 2 facing the copper layer 11. For example, this contact surface is soldered to the copper layer 11.

On the upper surface of the chip 2 facing away from the copper layer 11 and the lower surface, there is in each case a contact having a contact surface 210 facing away from the semiconductor chip 2.

If the semiconductor chip 2 is a transistor for example, the contact surface on the lower surface of this chip 2 is the contact surface of a collector or drain contact, and the contact on the upper surface of the semiconductor chip 2 is an emitter or source contact, whose contact surface is the contact surface 210.

The complete upper surface of the substrate 1 fitted with the semiconductor chip 2 is provided by the exposed parts of the upper surface of the substrate layer 10, the upper surface of the copper layer 11 outside the semiconductor chip 2 and by the exposed surface of each semiconductor chip 2 itself as defined by the upper surface and the lateral surface of this chip 2.

A layer 3 of electrically insulating plastic material is applied under vacuum onto the entire surface of the substrate 1 fitted with the semiconductor chip 2, so that the layer 3 of electrically insulating material covers with a tight fit the surface of the substrate 1 with the contact surfaces, said substrate being fitted with the semiconductor chip 2, and adheres to this surface. The layer 3 of electrically insulating material follows the surface contour of the layer formed by the parts of the upper surface of the substrate layer 10 that are to be exposed, the upper surface of the copper layer 11 outside the semiconductor chips 2, and the exposed surface of each semiconductor chip 2 itself as defined by the upper surface and the lateral surface of this chip 2.

In stage 301, the layer 3 made of an electrically insulating material is preferably applied by means of one or more of the following procedures: curtain casting, dipping, in particular single-sided dipping, spraying, in particular electrostatic spraying, printing, in particular screen printing, overmolding, dispensing, spin coating.

The layer 3 of electrically insulating material may also be applied particularly advantageously by lamination with a film, in particular a film made from a plastic material based on polyimide or epoxy. This may be followed by a tempering stage to improve adhesion.

The layer 3 comprising electrically insulating material acts as insulator and as base for a layer 4 of electrically conductive material applied subsequently.

Typical thicknesses of the layer 3 of electrically insulating material lie in the range 25-150 μm, whereby larger thicknesses can also be achieved from a series of thinner partial layers of electrically insulating material. This advantageously enables insulation field strengths in the region of several tens of kV/mm to be achieved.

Now each contact surface to which contact is to be made is exposed, in stage 302, by making a window 31 respectively in the layer 3 of electrically insulating material.

A contact surface to which contact is to be made is not just a contact surface 210 on a semiconductor chip 2, but may also be any area of the upper surface of the layer 11 made of copper or another metal that is exposed by making a window 31 in the layer 3 of electrically insulating material.

The size of the window to be made in order to make contact with the contact surface (210) is more than 60%—and, in particular, more than 80%—of the size of the component.

A window 31 is preferably made in the layer 3 of electrically insulating material by laser ablation.

Subsequently, in stage 303, planar contact is made with every exposed contact surface 210 of the component and every exposed contact surface 112 of the substrate by a layer 4 made of electrically conductive material, preferably metal, by metallizing and patterning the exposed contact surfaces 210 and 112 using standard techniques and thus making planar contact.

For example, the layer 4 comprising electrically conductive material can be applied unselectively both to every contact surface 210 and 112 and to the upper surface of the layer 3 of electrically insulating material facing away from the surface of the substrate 1, and then, for example, patterned by photolithography in such a way that every contact surface 210 and 112 remains in planar contact, and conductor tracks 4, 6 are formed over the contact surfaces 210 and 112 and the layer 3 made from insulating material.

The following process stages (semiadditive construction) are preferably performed:
  i. Sputtering of a Ti adhesive layer of approx 100 nm thickness and a Cu conductive layer 4 of approx. 200 nm thickness (stage 303).
  ii. Photolithography using thick resist layers or using photofilms 5 (stage 304).
  iii. Reinforcement of the exposed areas by electroplating of an electrically conductive layer 6. Layer thicknesses of up to 500 μm are possible here (stage 305).
  iv. Removal of resist layer and differential etching of Cu and Ti (stage 306).

It is also possible to proceed by applying a mask to the upper surface of the layer 3 of electrically insulating material facing away from the surface of the substrate 1, the mask leaving exposed the contact surfaces 210 and 112 and the areas for the conductor tracks 4, 6 which run over the contact surfaces 210 and 112 and the layer 3 of insulating material, and then applying the layer 4 of electrically conductive material unselectively to the mask and the contact surfaces 210 and 112 and to the areas left exposed by the mask. The mask is then removed together with the layer 4 on top of it, so that all that remains are the contact surfaces 210 and 112 making planar contact and the conductor tracks 4, 6 on the mask-free areas, said tracks running over the contact surfaces 210 and 112 and the layer 3 made from insulating material.

Either way results subsequently in a device comprising a substrate 1 having a component 2 with a surface on which electrical contact surfaces 210, 112 are arranged, in which an insulator in the form of a layer 3 made of electrically insulating material is applied to the surface, making a tight fit with the surface and adhering to the surface, and in which the layer 3 of electrically insulating material has windows 31 in each contact surface 210 and 112 in which this contact surface 210 and 112 is clear of the layer 3 made from electrically insulating material and is in planar contact with a layer 4 and additionally, for example, with a layer 6 made of electrically conductive material. Special embodiments of this device result from the above description.

The invention claimed is:

1. A method of manufacturing a device having a contact structure, the device comprising:
   a component having an electrical contact surface, wherein the component is a power semiconductor; and
   a substrate, the component arranged on the substrate, the method comprising:
   attaching a contiguous insulating layer of electrically insulating material to the substrate and to the component such that the electrical contact surface of the component remains at least partly free of insulating material, wherein the insulating material covers edges of the component facing away from the substrate; and
   applying a contiguous conducting layer of electrically conductive material onto the insulating layer and onto the contact surface, wherein attaching the insulating layer results in a free conduct surface comprising at least 60% of an extent of the component and applying the conducting layer includes arranging at least two part conducting layers having different electrically conductive materials one above the other.

2. The method according claim 1, wherein arranging at least one of the part conducting layers includes electroplating electrically conductive material.

3. The method according to claim 2, wherein an upper part conducting layer is arranged by electroplating.

4. The method according to claim 1, wherein the free conduct surface comprises at least 80% of the extent of the component.

5. The method according to claim 1, wherein attaching the insulating layer includes applying the electrically insulating material to the component and removing the electrically insulating material such that the contact surface is set free.

6. The method according to claim 5, wherein removing the electrically insulating material includes laser ablation.

7. The method according to claim 5, wherein the electrically insulating material is photosensitive and removing the electrically insulating material includes a photo-lithographic process.

8. The method according to claim 1, wherein the free conduct surface comprises not more than 95% of the extent of the component.

9. The method according to claim 1, wherein the substrate comprises an electrical substrate contact surface and wherein applying the conducting layer includes applying the conducting layer onto the electrical substrate contact surface.

10. The method according to claim 1, wherein attaching the insulating layer includes applying the electrically insulating material by applying a method chosen from the group consisting of curtain coating, dipping, discharge coating, printing, overmolding, dispensing, spin coating, and laminating a foil.

11. The method according to claim 10, wherein attaching the insulating layer includes laminating a foil, and the foil is based on a plastic material chosen from the group consisting of Polyimide, Polyethylene, Polyphenol, Polyether Etherketone, and epoxy.

12. The method according to claim 10, wherein attaching the insulating layer includes laminating a foil and performing a temper stage after the laminating.

13. The method according to claim 1, wherein the component comprises a thickness of at least 70 µm in a direction orthogonal to a surface of the substrate, and wherein the substrate comprises a conductor track having a thickness of at least 70 µm.

14. The method according to claim 1, wherein the component and the substrate form a surface contour, and attaching of the insulating layer is performed such that the insulating layer follows the surface contour.

15. The method according to claim 1, wherein attaching of the insulating layer is performed such that a thickness of the insulating layer covering a straight-edged area of the substrate differs by less than 50% form a thickness of the insulating layer covering a straight-edged area of the component.

16. The method according to claim 15, wherein the thickness of the insulating layer covering the straight-edged area of the substrate differs by less than 20% form the thickness of the insulating layer covering the straight-edged area of the component.

17. The method according to claim 16, wherein the device is a multilayer device, and, for manufacturing the multilayer device, attaching the insulating layer and applying the conducting layer are performed several times.

18. A device comprising:
a power semiconductor having an electrical contact surface;
a substrate, the power semiconductor arranged on the substrate;
an insulating layer of electrically insulating material attached onto the substrate and onto the power semiconductor such that the electrical contact surface of the power semiconductor remains at least partly free of insulating material resulting in a free conduct surface comprising at least 60% of an extent of the power semiconductor, wherein the insulating material covers edges of the power semiconductor facing away from the substrate; and
an electrical contacting layer, wherein the conducting layer comprises at least two part conducting layers having different electrically conductive materials one above the other.

19. The device according to claim 18, wherein a first copper layer is applied to a lower surface of the substrate, and wherein a second copper layer is applied to a surface of the substrate facing away from the lower surface.

20. The device according to claim 18, wherein the substrate and the power semiconductor form a first surface contour on a side of the substrate, wherein the layer of electrically insulating material follows the first surface contour, so that the first surface contour of the layer of electrically insulating material facing away from the side of the substrate corresponds to the surface contour formed by the substrate and component, and wherein conductor tracks follow a second surface contour formed by the substrate, the power semiconductor and the insulating material covering edges of the power semiconductor.

\* \* \* \* \*